United States Patent [19]

Crocker et al.

[11] Patent Number: 4,524,443

[45] Date of Patent: Jun. 18, 1985

[54] HIGH SPEED SOLID STATE MULTIPLEXER

[75] Inventors: David R. Crocker; Desi D. Stelling, both of Phoenix, Ariz.; Francis W. Larson, Rio Rancho, N. Mex.

[73] Assignee: Sperry Corporation, New York, N.Y.

[21] Appl. No.: 564,259

[22] Filed: Dec. 22, 1983

[51] Int. Cl.³ .................. H04J 3/04; H04K 19/08
[52] U.S. Cl. .................. 370/112; 307/243; 328/154; 328/104
[58] Field of Search .................. 370/112; 307/243; 328/104, 154

[56] References Cited

U.S. PATENT DOCUMENTS

| | | | |
|---|---|---|---|
| 3,760,358 | 9/1973 | Isii et al. | 328/154 |
| 3,783,307 | 1/1974 | Brever | 307/243 |
| 3,832,494 | 8/1974 | Seim et al. | 370/112 |
| 3,838,296 | 9/1974 | McLeod | 307/243 |
| 4,223,235 | 9/1980 | Rufray | 328/104 |
| 4,354,266 | 10/1982 | Copperman et al. | 370/112 |

Primary Examiner—Douglas W. Olms
Assistant Examiner—Curtis A. Kuntz
Attorney, Agent, or Firm—Howard P. Terry

[57] ABSTRACT

A multiplexing apparatus for outputting selected input signals utilizes input transistors coupled between input sources and diodes. A first set of switching transistors, coupled to the input transistors and the diodes, blocks the outputting of nonselected input signals by applying a predetermined voltage to the anodes of corresponding diodes. A second set of switching transistors, coupled to the input transistors and the diodes, permits the outputting of selected input signals on the emitters of output transistors coupled to the diodes, by applying current to the emitters of corresponding input transistors, and the anodes of corresponding diodes.

16 Claims, 5 Drawing Figures

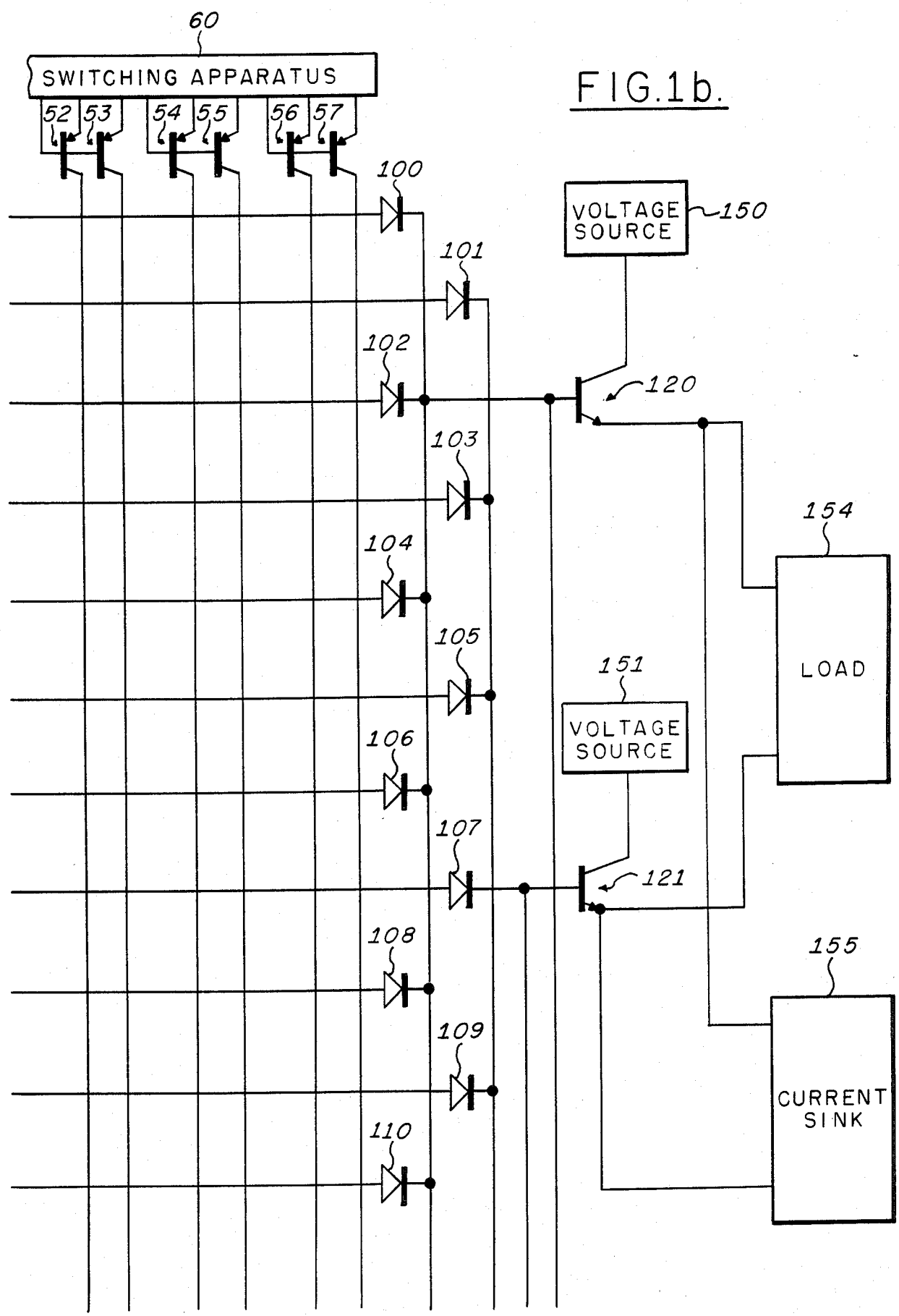

HIGH SPEED SOLID STATE MULTIPLEXER

ORIGIN OF THE INVENTION The U.S. Government has certain rights in this invention pursuant to Contract No. F3365-75-C-0310 awarded by the Department of the Air Force.

BACKGROUND OF THE INVENTION

1. Field of the Invention

The present invention relates generally to multiplexers, and more particularly to high speed, solid state multiplexers.

2. Description of the Prior Art

Prior art multiplexers have utilized mechanical relays to effect a selection amongst various input sources. Mechanical relays exhibit a relatively high rate of failure. Accordingly, as the number of input sources, and therefore the number of relays increase, such multiplexers display commensurately diminished reliability.

Prior art multiplexers have also utilized solid state chips comprising switches in series and switches which shunt to ground, to effect a selection amongst various input sources. Due to distributed capacitance within the circuitry of such multiplexers, the output of a selected source is corrupted by signals from the non-selected sources.

Accordingly, the number of input sources which can be efficaciously accommodated is limited by this engendered crosstalk. Further, as the number of input sources and the number of components increase in such multiplexers, the frequency response degenerates and the power consumption rises.

Thus, there is a need for a multiplexer which possesses a rapid response and can reliably serve a large number of input sources without disabling crosstalk.

SUMMARY OF THE INVENTION

The present invention entails a multiplexing apparatus for receiving a plurality of pairs of input signals from a plurality of input sources, each comprising high and low voltage input sources, and for outputting one or more selected pairs of input signals. The voltages of the input signals fall within a predetermined range. The multiplexing apparatus comprises a unit which includes a first plurality of pairs of transistors, the bases of each pair of transistors for coupling, respectively, to the high and low voltage sources of one of the input sources. The unit further contains means for applying a predetermined voltage to the collector of each transistor in the first plurality of pairs of transistors. A plurality of pairs of diodes are coupled, respectively, to the first plurality of pairs of transistors such that the anodes of each pair of diodes are coupled, respectively, to the emitters of a corresponding pair of transistors in the first plurality of pairs of transistors. A second plurality of pairs of transistors are coupled, respectively, to the first plurality of pairs of transistors such that the collectors of each pair of transistors in the second plurality of pairs of transistors are coupled, respectively, to the emitters of a corresponding pair of transistors in the first plurality of pairs of transistors. The collector of each transistor in the second plurality of transistors is coupled to the anode of the same diode to which the corresponding transistor in the first plurality of pairs of transistors is coupled. The unit additionally includes means for applying a predetermined voltage to the bases of a selected pair of transistors in the second plurality of pairs of transistors, and means for applying a predetermined current to the emitters of the selected pair of transistors. A third plurality of pairs of transistors are coupled, respectively, to the first plurality of pairs of transistors such that the emitters of each pair of transistors in the third plurality of pairs of transistors are coupled, respectively, to the emitters of a corresponding pair of transistors in the first plurality of pairs of transistors. The emitter of each transistor in the third plurality of pairs of transistors is coupled to the anode of the same diode to which the corresponding transistor in the first plurality of pairs of transistors is coupled. Means is included for applying a predetermined voltage to the collector of each transistor of the third plurality of pairs of transistors, and for applying a predetermined voltage to the bases of a selected pair of transistors in the third plurality of pairs of transistors. The base of a first output transistor is coupled to the cathode of one diode in each pair of diodes, and the base of a second output transistor is coupled to the cathode of the other diode in each pair of diodes. Means for applying a predetermined voltage to the collector of the first output transistor is utilized, as well as means for applying a predetermined voltage to the collector of the second output transistor. The unit also includes means coupled to the cathode of each diode, for sinking a predetermined portion of the predetermined current applied to the emitters of the selected pair of transistors in the second plurality of pairs of transistors through the pair of diodes coupled to this selected pair of transistors.

In operation, the third plurality of pairs of transistors blocks the outputting of nonselected input signals by applying a predetermined voltage to the anodes of corresponding diodes. The second plurality of pairs of transistors permits the outputting of selected input signals on the emitters of the output transistors by applying current to the emitters of the corresponding transistors in the first plurality of pairs of transistors, and to the anodes of the corresponding diodes.

The present invention also entails a multiplexing apparatus for receiving a plurality of input signals from a plurality of input sources, each of which provides only a single input signal, and for outputting one or more selected input signals. The configuration and operation of this embodiment of the invention are analogous to that described above, pairs of components in the above description being replaced, generally, by individual ones.

In preferred embodiments of the inventon, the predetermined portion of the predetermined current, sunk through the diodes is substantially one-half. Sinking this portion of the current applied to selected transistors provides for a rapid frequency response.

The present invention minimizes stray and component capacitances. Inherent residual circuit capacitances are charged at an extremely high rate, resulting in increased bandwidth capability. The invention requires low power circuitry and relatively few components, and may be utilized in conjunction with a large number of input sources without loss of reliability, without diminished frequency response, and without disabling crosstalk.

DESCRIPTION OF THE PREFERRED EMBODIMENTS

Figure 1A:
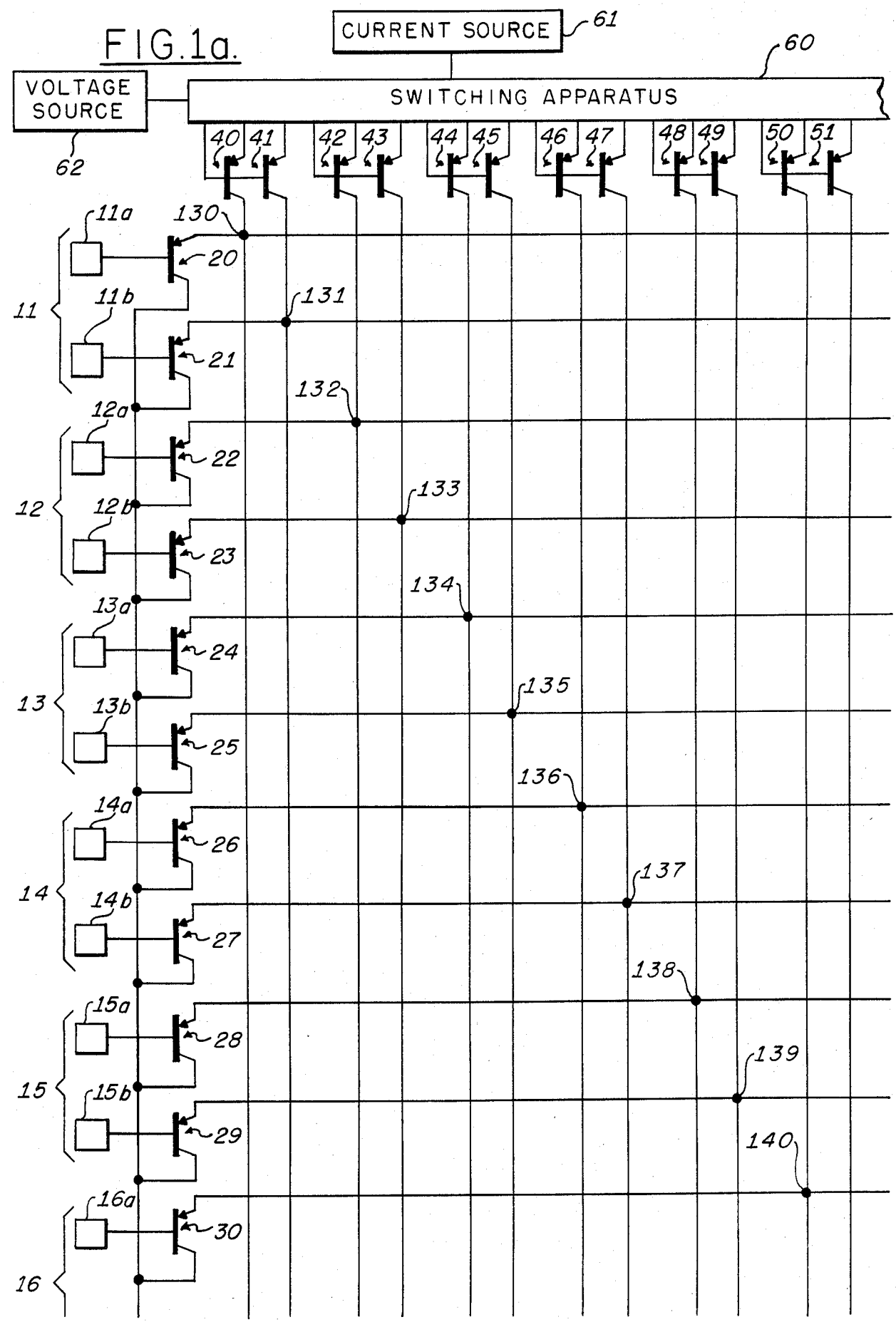
FIGS. 1 a–d are schematic diagrams, partially in block form, of a preferred embodiment of the invention, and input sources, each input source comprising high and low voltage input sources.
Figure 1C:
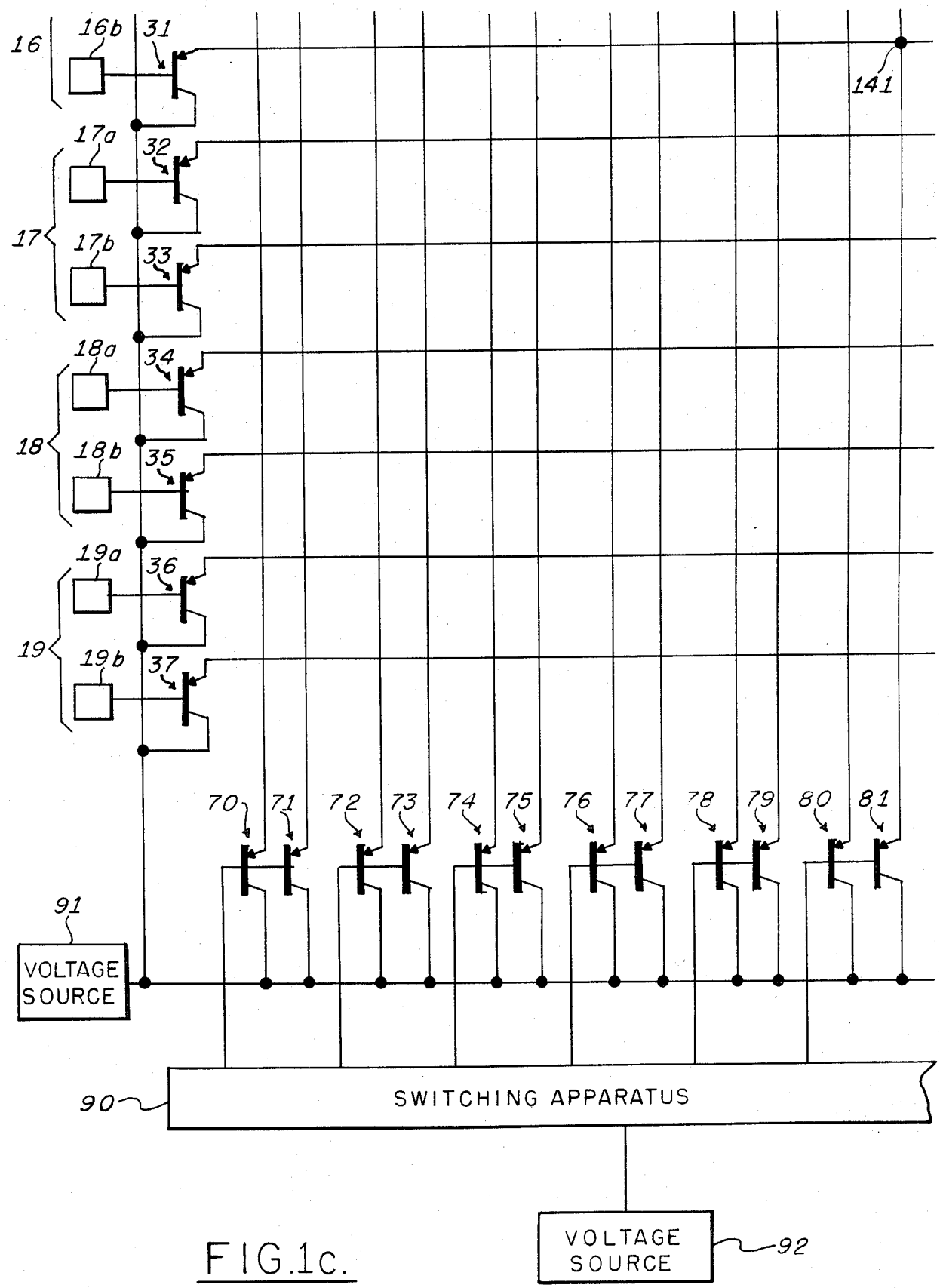
Figure 1D:
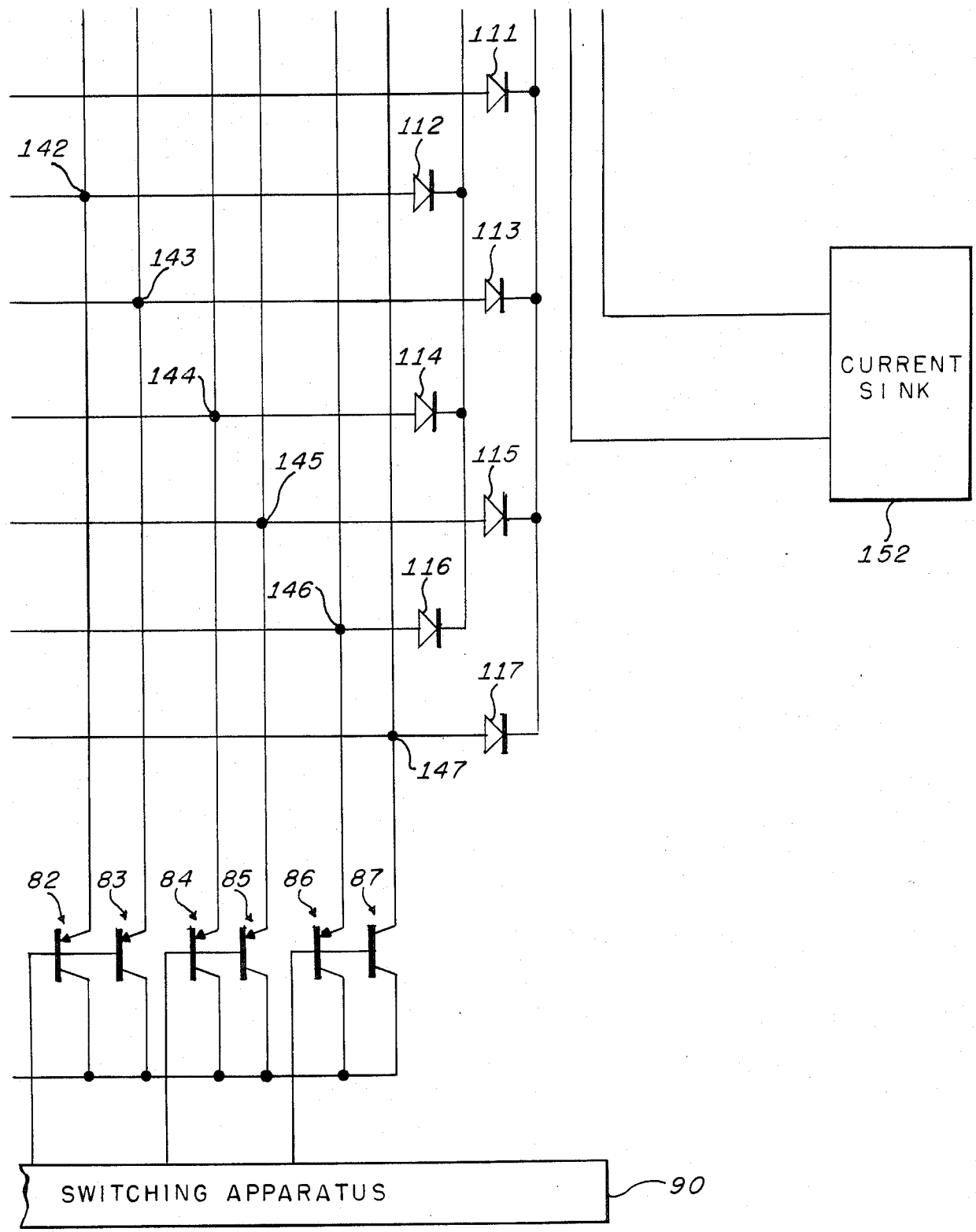

The present invention entails a multiplexing apparatus for selecting amongst various input sources and providing an output corresponding to the selection. Referring to FIG. 1, a source 11 comprises a high voltage source 11a, and a low voltage source 11b, wherein the voltage provided by the high voltage source 11a is at least that provided by the low voltage source 11b. The base of a transistor 20 is coupled to the high voltage source 11a, and the base of a transistor 21 is coupled to the low voltage source 11b. Similarly, sources 12 through 19 comprise, respectively, high voltage sources 12a through 19a, and low voltage sources 12b through 19b. The bases of transistors 22, 24, 26, 28, 30, 32, 34, and 36 are coupled to, respectively, high voltage sources 12a, 13a, 14a, 15a, 16a, 17a, 18a, and 19a. The bases of transistors 21, 23, 25, 27, 29, 31, 33, 35, and 37 are coupled to, respectively, low voltage sources 12b, 13b, 14b, 15b, 16b, 17b, 18b, and 19b. The collectors of the transistors 20-37 are coupled to a voltage source 91. The collector of a transistor 40 is coupled to the emitter of the transistor 20, and the collector of a transistor 41 is coupled to the emitter of the transistor 21. In this fashion, the transistors 40 and 41 are coupled, respectively, to the transistors 20 and 21 associated with the source 11. The bases of the transistors 40 and 41 are coupled, and the base of the transistor 40 is coupled to a switching apparatus 60. The emitters of the transistors 40 and 41 are coupled to the switching apparatus 60. Similarly, the base of a transistor 43 is coupled to the base of a transistor 42, with the base of the transistor 42 and the emitters of the transistors 42 and 43 coupled to the switching apparatus 60. The collectors of the transistors 42 and 43 are coupled to, respectively, the emitters of the transistors 22 and 23 associated with the source 12.

Transistors 44-57 are paired and coupled in an analogous manner, each pair being coupled to the switching apparatus 60, and to the transistors associated with a corresponding source. The switching apparatus 60 is coupled to a current source 61 and a voltage source 62. By means of the switching apparatus 60, a predetermined voltage may be applied to the bases of a selected pair of the transistors 40-57, and a predetermined current may be applied to the emitters of the selected pair.

The base of a transistor 71 is coupled to the base of a transistor 70, and the base of the transistor 70 is coupled to a switching apparatus 90. The collectors of the transistors 70 and 71 are coupled to the voltage source 91. The emitters of the transistors 70 and 71 are coupled to, respectively, the emitters of the transistors 20 and 21 associated with the source 11. Similarly, the base of a transistor 73 is coupled to the base of a transistor 72, and the base of the transistor 72 is coupled to the switching apparatus 90. The collectors of the transistors 72 and 73 are coupled to the voltage source 91. The emitters of the transistors 72 and 73 are coupled to, respectively, the emitters of the transistors 22 and 23 associated with the source 12. Transistors 74-87 are paired and coupled in an analogous manner, each pair being coupled to the voltage source 91, to the switching apparatus 90, and to the transistors associated with a corresponding source. The switching apparatus 90 is coupled to a voltage source 92. By means of the switching apparatus 90, a predetermined voltage may be applied to the bases of a selected pair of the transistors 70-87.

The anode of a diode 100 is coupled to the collector of the transistor 40, and to the emitter of the transistor 70. Preferably, the anode of the diode 100, the emitter of the transistor 20, the collector of the transistor 40, and the emitter of the transistor 70 are each coupled to a node 130. The cathode of the diode 100 is coupled to the base of a transistor 120. The anode of a diode 101 is coupled to the collector of the transistor 41, and to the emitter of the transistor 71. Preferably, the anode of the diode 101, the emitter of the transistor 21, the collector of the transistor 41, and the emitter of the transistor 71 are each coupled to a node 131. The cathode of the diode 101 is coupled to the base of a transistor 121. In this fashion, the diodes 100 and 101 are associated with the source 11. Diodes 102-117 are coupled in an analogous manner: the anodes of the diodes 102-117 are coupled to, respectively, the collectors of the transistors 42-57, and to, respectively, the emitters of the transistors 72-87. Preferably, the anodes of the diodes 102-117, the emitters of the transistors 22-37, the collectors of the transistors 42-57, and the emitters of the transistors 72-87 are each coupled, respectively, to nodes 132-147. The cathodes of the diodes 102, 104, 106, 108, 110, 112, 114 and 116 are coupled to the base of the transistor 120. The cathodes of the diodes 103, 105, 107, 109, 111, 113, 115 and 117 are coupled to the base of the transistor 121. In this fashion, a pair of the diodes 102-117 is associated with each of the sources 12-19.

The collector of the transistor 120 is coupled to a voltage source 150. The collector of the transistor 121 is coupled to a voltage source 151. A current sink 152 is coupled between the base of the transistor 120 and the cathodes of the diodes 100, 102, 104, 106, 108, 110, 112, 114, and 116. The current sink 152 is also coupled between the base of the transistor 121 and the cathodes of the diodes 101, 103, 105, 107, 109, 111, 113, 115, and 117. The current sink 152 diverts a predetermined portion of the current applied to the selected pair of the transistors 40-57 through the corresponding pair of the diodes 100-117. The residual current flows to the emitters of the corresponding pair of the transistors 20-37. Preferably, the predetermined portion is substantially one-half.

A load 154 is coupled to the emitters of the transistors 120 and 121. A current sink 155, sufficient to drive the load 154, is coupled between the load 154 and the emitters of the transistors 120 and 121.

In operation, each of the input sources 11-19 provides a high input voltage and low input voltage. These input voltages are presumed, without loss of generality, to be in the range $-V_I$ to $V_I$, where $V_I$ is a fixed but arbitrary positive voltage. One of the input sources 11-19, say input source 13, is chosen to have its high and low input voltages outputted. To this end, by means of the switching apparatus 60, a voltage more positive than $V_I$ is applied by the voltage source 62 to the bases of the pair of the transistors 40-57 whose collectors are coupled, respectively, to the emitters of the pair of the transistors 20-37 whose bases are coupled, respectively, to the high and low voltage input sources of the chosen input source. In this case, the bases of the pair of transistors 24 and 25 are coupled, respectively, to the high and low voltage input sources 13a and 13b of the input source 13. Accordingly, the voltage more positive than $V_I$ is applied by the voltage source 62, via the switching mechanism 60, to the bases of the pair of transistors 44 and 45 whose collectors are coupled, respectively, to the emitters of the pair of transistors 24 and 25.

Also, by means of the switching apparatus 60, a current is applied by the current source 61 to the emitters of that same pair of the transistors 40–57 to whose bases the voltage more positive than $V_I$ is applied. In this case, the current is applied to the emitters of the pair of transistors 44 and 45. The magnitude of this applied current depends upon slew rate requirements and distributed circuit and device capacitances.

A voltage more negative than $-V_I$ is applied by the voltage source 91 to the collectors of the transistors 20–37, and to the collectors of the transistors 70–87.

By means of the switching apparatus 90, a voltage more positive than $V_I$ is applied by the voltage source 92 to the bases of the pair of the transistors 70–87 whose emitters are coupled, respectively, to the emitters of the pair of the transistors 20–37 whose bases are coupled, respectively, to the high and low voltage input sources of the chosen input source. In this case, as before, the pair of transistors 24 and 25 are coupled to the source 13. Accordingly, the voltage more positive than $V_I$ is applied by the voltage source 92, via the switching apparatus 90, to the bases of the pair of transistors 74 and 75 whose emitters are coupled, respectively, to the emitters of the pair of transistors 24 and 25. In this fashion, the pair of transistors 74 and 75 is turned off, and since no voltage is applied by the voltage source 92 to the bases of the transistors 70–73 and 76–87, these transistors are on. Accordingly, the emitters of the transistors 20–23 and 26–37 which are coupled, respectively, to the emitters of the transistors 70–73 and 76–87 are at substantially the voltage more negative than $-V_I$ applied by the voltage source 91 to the collectors of the transistors 70–87. The anodes of the diodes 100–103 and 106–117 which are coupled, respectively, to the emitters of the transistors 70–73 and 76–87 are also at substantially the voltage more negative than $-V_I$ applied by the voltage source 91 to the collectors of the transistors 70–87. A predetermined portion of the current flowing from the collectors of the transistors 44 and 45 flows to the emitters of the transistors 24 and 25. Accordingly, the transistors 24 and 25 function as emitter followers, that is, the voltages appearing on the emitters follow, respectively, the voltages applied to the bases of the transistors 24 and 25 by, respectively, the high voltage input source 13a and the low voltage input source 13b. The voltages on the emitters of the transistors 24 and 25 appear, respectively, on the anodes of the diodes 104 and 105. The voltages on the bases of the transistors 24 and 25 appear, respectively, on the cathodes of the diodes 104 and 105. Currents flow through the diodes 104 and 105 to the current sink 152. The current sink 152 is such that the currents flowing through the diodes 104 and 105 are preferably, respectively, substantially one-half of the currents flowing through the collectors of the transistors 44 and 45. The voltage on the cathode of the diode 104, which is between $-V_I$ and $V_I$, appears on the cathodes of the diodes 100, 102, 106, 108, 110, 112, 114 and 116. Since the voltage on the anodes of the diodes 100, 102, 106, 108, 110, 112, 114 and 116 is more negative than $-V_I$, the voltage difference between the anodes and the cathodes of these diodes is negative, and no current flows there through. Similarly, the voltage on the cathode of the diode 105, which is between $-V_I$ and $V_I$, appears on the cathodes of the diodes 101, 103, 107, 109, 111, 113, 115, and 117. Since the voltage on the anodes of the diodes 101, 103, 107, 109, 111, 113, 115 and 117 is more negative than $-V_I$, the voltage difference between the anodes and the cathodes of these diodes is negative, and no current flows therethrough. Thus, the input signals from the sources 11, 12, and 14–19 are blocked by the diodes 100–103 and 106–117.

A voltage more positive than $V_I$ is applied by the voltage source 150 to the collector of the transistor 120, and a voltage more positive than $V_I$ is applied by the voltage source 151 to the collector of the transistor 121. Accordingly, the transistors 120 and 121 function as emitter followers, that is, the voltages appearing on the emitters of the transistors 120 and 121 follow, respectively, the voltages applied to the bases of the transistors 120 and 121 via, respectively, the diodes 104 and 105. In this fashion, the emitters of the transistors 120 and 121 follow, respectively, the input voltages of the high voltage input source 13a and the low voltage input source 3b.

The load 154, coupled to the emitters of the transistors 120 and 121, is driven by the current sink 155 which is coupled between the load 154 and the emitters of the transistors 120 and 121.

Any of the other input sources 11, 12, 14–19 may be chosen and have its inputs outputted in a similar manner.

If each of the input sources entails only a single voltage input source, the apparatus of FIG. 1 can be altered to accommodate such sources by merely eliminating the components associated with the deleted inputs. For example, referring to FIG. 1, if each of the input sources 11–19 comprises but a single voltage input source, say, respectively, the voltage input sources 11a–19a, then the transistors and diodes corresponding to the omitted input sources 11b–19b are removed. For instance, with the elimination of the voltage input source 13b the corresponding transistors 25, 45, and 75, and the corresponding diode 105 are removed. The transistor 121 is also deleted. In this fashion, by eliminating one of the two elements from each of the pairs of components associated with each of the input sources 11–19, the apparatus of FIG. 1 can readily be converted to output a chosen input source comprising a single voltage input source.

The present invention may be utilized in conjunction with any number of input sources. The input sources may be of either the single or double voltage input variety. The apparatuses described above may serve fewer input sources by leaving some of the components uncoupled or by eliminating unused components. For example, referring to FIG. 1, N input sources, where $N \leq 8$, may be served by coupling the N input sources to corresponding pairs of the transistors 20–37, leaving 9−N pairs of the transistors 20–37 uncoupled. Alternatively, unutilized pairs of the transistors 20–37 and associated components may be eliminated from the apparatus, when fewer input sources are served. For example, if only 8 input sources are to be coupled to the transistors 20–37, the pair of the transistors 36 and 37 may be removed, along with the associated transistors 56 and 57, 86 and 87, and the associated diodes 116 and 117. The apparatuses described above may also be readily altered to serve additional input sources, by simply appending the corresponding transistors and diodes. For example, referring to FIG. 1, if a tenth input source comprising two voltage input sources is also to be served, then the configuration of components associated with any of the other input sources is simply replicated for the additional input source. For instance, the configuration described above, of the transistors 24 and 25, the transistors 44 and 45, the transistors 74 and 75, and the diodes 104 and 105 associated with the input source 13 is duplicated for each additional input source.

Referring to FIG. 1, the switching apparatuses 60 and 90 are well-known in the art, and may comprise commercially available, digitally activated equipment, or may be readily contrived by one of ordinary skill in the art. Also, the current sinks 152 and 155 are conventional mechanisms, readily implemented by one of ordinary skill in the art.

Figure 2:
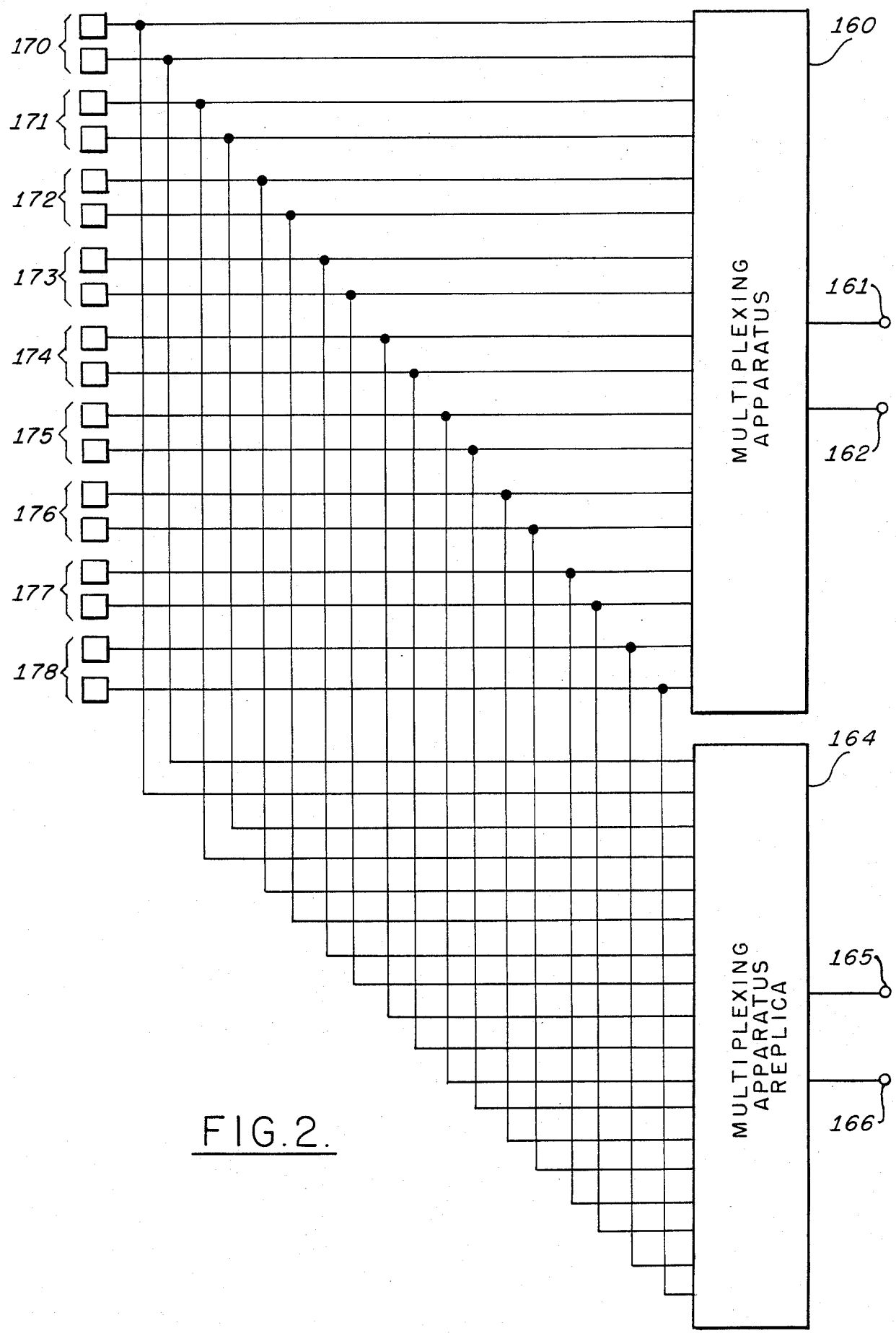
FIG. 2 is a block diagram of a preferred embodiment of the invention for outputting more than one selected pair of input signals.

The apparatuses described above for outputting a selected input source may be expanded to provide more than one output. Referring to FIG. 2, a multiplexing apparatus 160, representing the apparatus of FIG. 1 without the input sources 11-19, the load 154, and the current sink 155, is coupled as indicated in FIG. 1 to input sources 170-178. One of the sources 170-178 may be selected and outputted on output terminals 161 and 162 which correspond to the emitters of the transistors 120 and 121 of FIG. 1. A multiplexing apparatus 164, which is a replica of the multiplexing apparatus 160, is coupled in the same fashion as the multiplexing apparatus 160 to the input sources 170-178. Any one of the input sources 170-178 may be selected by the multiplexing apparatus 164 and outputted on output terminals 165 and 166. In this manner, two independent selections from the input sources 170-178 may be outputted. Additional replicas of the multiplexing apparatus 160 may be coupled in similar fashion to the input sources 170-178 to provide any number of outputs corresponding to independent selections from the input sources 170-178. For input sources each comprising only a single voltage input source, the multiplexing apparatus described above utilized in conjunction therewith may be expanded in a similar fashion to output any number of independently selected input sources.

While the invention has been described in its preferred embodiments, it is to be understood that the words which have been used are words of description rather than limitation and that changes may be made within the purview of the appended claims without departing from the true scope and spirt of the invention in its broader aspects.

We claim:

1. A multiplexing apparatus for receiving a plurality of pairs of input signals, having voltages in a predetermined range, from a plurality of input sources each comprising high and low voltage input sources, and for outputting at least one pair of input signals selected from said plurality of pairs of input signals, comprising:
    a unit, including:
    a first plurality of pairs of transistors, the bases of each pair of transistors in said first plurality of pairs of transistors for coupling, respectively, to high and low voltage input sources of one of said input sources;
    means for applying a predetermined voltage to the collector of each transistor in said first plurality of pairs of transistors;
    a plurality of pairs of diodes, coupled, respectively, to said first plurality of pairs of transistors such that the anodes of each pair of diodes are coupled, respectively, to the emitters of a corresponding pair of transistors in said first plurality of pairs of transistors;
    a second plurality of pairs of transistors, coupled, respectively, to said first plurality of pairs of transistors such that the collectors of each pair of transistors in said second plurality of pairs of transistors are coupled, respectively, to the emitters of a corresponding pair of transistors in said first plurality of pairs of transistors, the collector of each transistor in said second plurality of pairs of transistors being coupled to the anode of the same diode in said plurality of pairs of diodes to which a corresponding transistor in said first plurality of pairs of transistors is coupled;
    means for applying a predetermined voltage to the bases of a selected pair of transistors in said second plurality of pairs of transistors;
    means for applying a predetermined current to the emitters of said selected pair of transistors in said second plurality of pairs of transistors;
    a third plurality of pairs of transistors, coupled, respectively, to said first plurality of pairs of transistors such that the emitters of each pair of transistors in said third plurality of pairs of transistors are coupled, respectively, to the emitters of a corresponding pair of transistors in said first plurality of pairs of transistors, the emitter of each transistor in said third plurality of pairs of transistors being coupled to the anode of the same diode, in said plurality of pairs of diodes, to which a corresponding transistor in said first plurality of pairs of transistors is coupled;
    means for applying a predetermined voltage to the collector of each transistor in said third plurality of pairs of transistors;
    means for applying a predetermined voltage to the bases of a selected pair of transistors in said third plurality of pairs of transistors;
    a first output transistor, the base of said first output transistor being coupled to the cathode of a first diode in each pair of said plurality of pairs of diodes;
    means for applying a predetermined voltage to the collector of said first output transistor;
    a second output transistor, the base of said second output transistor being coupled to the cathode of a second diode in each pair of said plurality of pairs of diodes;
    means for applying a predetermined voltage to the collector of said second output transistor; and
    means, coupled to the cathode of each diode in said plurality of pairs of diodes, for sinking a predetermined portion of said predetermined current applied to the emitters of said selected pair of transistors in said second plurality of pairs of transistors through a pair of diodes, in said plurality of pairs of diodes, coupled to said selected pair of transistors in said second plurality of pairs of transistors.

2. A multiplexing apparatus as in claim 1 wherein said means for applying a predetermined voltage to the collector of each transistor of said first plurality of pairs of transistors, and said means for applying a predetermined voltage to the collector of each transistor of said third plurality of pairs of transistors comprise a first voltage source coupled to the collector of each transistor of said first and third plurality of pairs of transistors.

3. A multiplexing apparatus as in claim 2 wherein said means for applying a predetermined voltage to the bases of a selected pair of transistors of said second plurality of pairs of transistors comprises a second voltage source and switching means for coupling said second voltage source to the bases of said selected pair of transistors of said second plurality of pairs of transistors, wherein said means for applying a predetermined current to the emitters of said selected pair of transistors of said second plurality of pairs of transistors comprises a current source and said switching means, additionally for coupling said current source to the emitters of said selected pair of transistors of said second plurality of pairs of transistors, and wherein said means for applying a predetermined voltage to the bases of a selected pair of transistors of said third plurality of pairs of transistors comprises a third voltage source and switching means for coupling said third voltage source to the bases of said selected pair of transistors of said third plurality of pairs of transistors.

4. A multiplexing apparatus as in claim 3 wherein said means for applying a predetermined voltage to the collector of said first output transistor comprises a voltage source coupled to the collector of said first output transistor, and wherein said means for applying a predetermined voltage to the collector of said second output transistor comprises a voltage source coupled to the collector of said second output transistor.

5. A multiplexing apparatus as in claim 4 wherein said current sinking means comprises a current sink, coupled to the cathode of each diode in said plurality of pairs of diodes.

6. A multiplexing apparatus as in claim 5 wherein said predetermined portion of said predetermined current is substantially one-half.

7. A multiplexing apparatus as in claim 5 further comprising means, coupled to the emitters of said first and second output transistors, for sinking current to drive a preselected load.

8. A multiplexing apparatus as in claim 1 further comprising at least one replica of said unit, the bases of each pair of transistors in said first plurality of pairs of transistors of said replica for coupling, respectively, to high and low voltage input sources of one of said input sources.

9. A multiplexing apparatus for receiving a plurality of input signals, having voltages in a predetermined range, from a plurality of input sources, and for outputting at least one input signal selected from said plurality of input signals, comprising:

a unit, including:
a first plurality of transistors, the base of each transistor in said first plurality of transistors for coupling to one of said input sources;
means for applying a predetermined voltage to the collector of each transistor in said first plurality of transistors;
a plurality of diodes, coupled, respectively, to said first plurality of transistors such that the anode of each diode is coupled to the emitter of a corresponding transistor in said first plurality of transistors;
a second plurality of transistors, coupled, respectively, to said first plurality of transistors such that the collector of each transistor in said second plurality of transistors is coupled to the emitter of a corresponding transistor in said first plurality of transistors, the collector of each transistor in said second plurality of transistors being coupled to the anode of the same diode, in said plurality of diodes, to which a corresponding transistor in said first plurality of transistors is coupled;
means for applying a predetermined voltage to the base of a selected transistor in said second plurality of transistors;
means for applying a predetermined current to the emitter of said selected transistor in said second plurality of transistors;
a third plurality of transistors, coupled, respectively, to said first plurality of transistors such that the emitter of each transistor in said third plurality of transistors is coupled to the emitter of a corresponding transistor in said first plurality of transistors, the emitter of each transistor in said third plurality of transistors being coupled to the anode of the same diode, in said plurality of diodes, to which a corresponding transistor in said first plurality of transistors is coupled;
means for applying a predetermined voltage to the collector of each transistor in said third plurality of transistors;
means for applying a predetermined voltage to the base of a selected transistor in said third plurality of transistors;
an output transistor, the base of said output transistor being coupled to the cathode of each diode in said plurality of diodes;
means for applying a predetermined voltage to the collector of said output transistor; and
means, coupled to the cathode of each diode in said plurality of diodes, for sinking a predetermined portion of said predetermined current applied to the emitter of said selected transistor in said second plurality of transistors through a diode, in said plurality of diodes, coupled to said selected transistor in said second plurality of transistors.

10. A multiplexing apparatus as in claim 9 wherein said means for applying a predetermined voltage to the collector of each transistor in said first plurality of transistors, and said means for applying a predetermined voltage to the collector of each transistor in said third plurality of transistors comprise a first voltage source coupled to the collector of each transistor in said first and third plurality of transistors.

11. A multiplexing apparatus as in claim 10 wherein said means for applying a predetermined voltage to the base of a selected transistor in said second plurality of transistors comprises a second voltage source and switching means for coupling said second voltage source to the base of said selected transistor in said second plurality of transistors, wherein said means for applying a predetermined current to the emitter of said selected transistor in said second plurality of transistors comprises a current source and said switching means, additionally for coupling said current source to the emitter of said selected transistor in said second plurality of transistors, and wherein said means for applying a predetermined voltage to the base of a selected transistor in said third plurality of transistors comprises a third voltage source and switching means for coupling said third voltage source to the base of said selected transistor in said third plurality of transistors.

12. A multiplexing apparatus as in claim 11 wherein said means for applying a predetermined voltage to the collector of said output transistor comprises a voltage source coupled to the collector of said output transistor.

13. A multiplexing apparatus as in claim 12 wherein said current sinking means comprises a current sink, coupled to the cathode of each diode in said plurality of diodes.

14. A multiplexing apparatus as in claim 13 wherein said predetermined portion of said predetermined current is substantially one-half.

15. A multiplexing apparatus as in claim 13 further comprising means, coupled to the emitter of said output transistor, for sinking current to drive a preselected load.

16. A multiplexing apparatus as in claim 9 further comprising at least one replica of said unit, the base of each transistor in said first plurality of transistors of said replica for coupling to one of said input sources.

* * * * *